US009325165B2

(12) United States Patent
Behringer et al.

(10) Patent No.: US 9,325,165 B2
(45) Date of Patent: Apr. 26, 2016

(54) DEVICE AND METHOD FOR PROTECTING A CONSUMER

(75) Inventors: Klaus Behringer, Igensdorf (DE); Martin Maier, Erbendorf (DE); Klaus Pfitzner, Amberg (DE); Bernhard Rösch, Sulzbach-Rosenberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/344,985

(22) PCT Filed: Sep. 16, 2011

(86) PCT No.: PCT/EP2011/066092
§ 371 (c)(1),
(2), (4) Date: Mar. 14, 2014

(87) PCT Pub. No.: WO2013/037417
PCT Pub. Date: Mar. 21, 2013

(65) Prior Publication Data
US 2014/0375301 A1    Dec. 25, 2014

(51) Int. Cl.
*H02H 5/04* (2006.01)
*H02P 29/00* (2006.01)
(Continued)

(52) U.S. Cl.
CPC ............... *H02H 5/047* (2013.01); *G01K 7/01* (2013.01); *G01R 19/16571* (2013.01); *H02P 29/0088* (2013.01); *H02P 29/027* (2013.01); *H02H 3/085* (2013.01); *H02H 7/0852* (2013.01)

(58) Field of Classification Search
CPC ....................................................... H02H 5/04
See application file for complete search history.

(56) References Cited

U.S. PATENT DOCUMENTS 3,680,325 A    8/1972   Chigira
6,628,491 B1 *  9/2003   Tihanyi et al. ............... 361/93.8
(Continued)

FOREIGN PATENT DOCUMENTS

CN    1327603 A    12/2001
CN    1670497 A    9/2005
(Continued)

OTHER PUBLICATIONS

International Search Report PCT/ISA/210 for International Application No. PCT/EP2011/066092 Dated Oct. 4, 2012.
(Continued)

*Primary Examiner* — Tung X Nguyen
*Assistant Examiner* — Feba Pothen
(74) *Attorney, Agent, or Firm* — Harness, Dickey & Pierce, P.L.C.

(57) ABSTRACT

A device is disclosed for protecting a consumer, with a first current path having two lines, and a monitoring arrangement for detecting an imminent overload of the electrical consumer. In order to enable the detection of an imminent overload of a consumer, it is proposed that the monitoring arrangement includes a first temperature measuring unit, an evaluation unit and a first measuring element, which establishes an electrically conductive connection between the two lines of the first current path. The first temperature measuring unit is electrically isolated from the first measuring element and includes a first and a second temperature sensor. The first and second temperature sensor of the first temperature measuring unit are configured to simultaneously record a temperature of the first measuring element and the evaluation unit is configured to detect an imminent overload of the consumer based upon the recorded temperatures of the first temperature measuring unit.

21 Claims, 2 Drawing Sheets

(51) Int. Cl.
*H02P 29/02* (2006.01)
*G01K 7/01* (2006.01)
*G01R 19/165* (2006.01)
*H02H 7/085* (2006.01)
*H02H 3/08* (2006.01)

(56) References Cited

U.S. PATENT DOCUMENTS

| | | | |
|---|---|---|---|
| 6,671,152 | B1 | 12/2003 | Hersel et al. |
| 7,056,477 | B1 * | 6/2006 | Schwalbe et al. ............. 422/129 |
| 8,848,330 | B2 * | 9/2014 | Illing ............................ 361/103 |
| 2005/0146824 | A1 * | 7/2005 | Borrego Bel ................. 361/103 |
| 2005/0204761 | A1 | 9/2005 | Karikomi et al. |
| 2005/0238335 | A1 | 10/2005 | Miyazaki |
| 2009/0101821 | A1 * | 4/2009 | Masafumi .................. 250/338.3 |
| 2011/0109372 | A1 | 5/2011 | Zanardi et al. |
| 2012/0092797 | A1 | 4/2012 | Reeder et al. |

FOREIGN PATENT DOCUMENTS

| | | |
|---|---|---|
| CN | 101834558 A | 9/2010 |
| CN | 102171904 A | 8/2011 |
| DE | 102 13 617 A1 | 6/2003 |
| JP | H05276643 A | 10/1993 |

OTHER PUBLICATIONS

Written Opinion of the International Searching Authority PCT/ISA/237 for International Application No. PCT/EP2011/066092.
Office Action for Chinese Patent Application No. 2011800734264 dated Apr. 24, 2015 with English translation thereof.

* cited by examiner

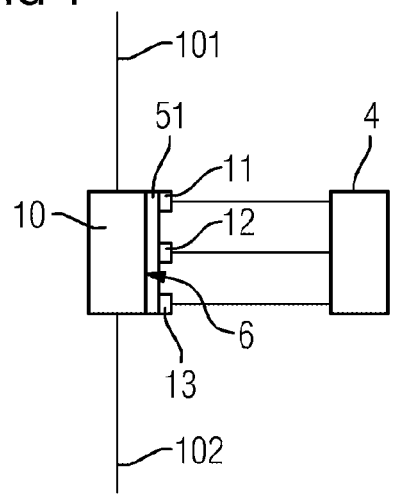
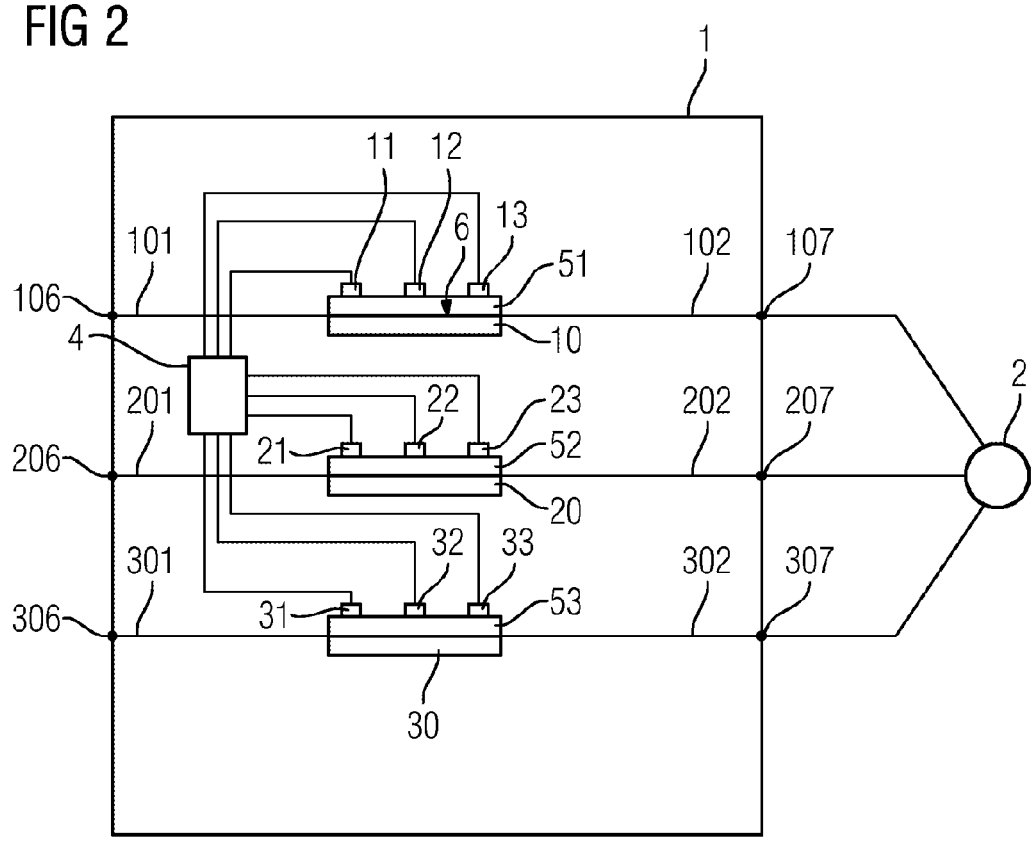

DEVICE AND METHOD FOR PROTECTING A CONSUMER

PRIORITY STATEMENT

This application is the national phase under 35 U.S.C. §371 of PCT International Application No. PCT/EP2011/066092 which has an International filing date of Sep. 16, 2011, which designated the United States of America, the entire contents of which are hereby incorporated herein by reference.

FIELD

At least one embodiment of the invention generally relates to a device and/or a method for protecting a load against overload, in particular thermal overload.

BACKGROUND

In particular an electric motor (e.g. an asynchronous motor) can be regarded herein as the load. A thermal overload on the load arises, for example, through mechanical overloading of an electric motor or the failure of a conducting route (phase) of the electric motor. This leads to undesirable heat generation at the load, which ultimately can lead to damaging of the load.

In order to detect an imminent thermal overload on an electrical load, devices are typically integrated into the conducting route via which the load is supplied with electrical energy, so that an imminent thermal overload on the load can be detected with said devices. Single-phase or multi-phase monitoring can take place, that is, a single conducting route (one phase) or a plurality of conducting routes (multiple phases) of the load can be monitored.

The respective devices have a current path for each conducting route to be monitored, by which the energy supply taking place via the conducting route is guided. The electrical energy of the load is therefore fed via the current path through the device. By way of a monitoring arrangement of the device, the current flow in the current path is monitored so that an imminent overload on the load can be detected. Devices of this type are, for example, overload relays or circuit breakers. Apart from protection against thermal overload by way of an A-release, a circuit breaker for a downstream load also has a short-circuit protection by way of an N-release.

In the present application, overload protection, in particular, is to be provided for a load (e.g. motors, lines, transformers and generators).

A variety of requirements are placed on a device for determining a thermal overload on a load:

The device should, as far as possible, be able to monitor both AC and DC currents so that both AC and DC loads can be monitored for overload.

The device should have the largest possible setting range. The setting range is the range within which monitoring of the operating current of the electrical load can take place. Said setting range is limited by the operating current upper limit $I_o$ and the operating current lower limit $I_U$ ($I_o$ to $I_u$). Using a setting device (e.g. a setting screw) at the device, the thermal overload release can be set to the relevant nominal current of the load, so that targeted monitoring of the downstream load to be monitored can take place.

The device should generate the smallest possible power loss.

The device should have the simplest possible electrical isolation between the current path to be monitored and the monitoring arrangement which detects the overload.

The device should have a thermal memory. I.e. if an imminent thermal overload on a load is detected, the current feed to the load should be interrupted for long enough until cooling of the load is assured. Thus, no immediate connection of a load should be enabled following the determination of a thermal overload.

If a thermal overload on a load is imminent, an increased current rise takes place in the individual conducting routes (phases) of the load. A device connected upstream of the load for monitoring a thermal overload on the load can therefore detect and evaluate this increased current rise by monitoring the current path thereof. Different measuring principles can be used for this. Detection of an imminent overload can therefore be carried out with different monitoring arrangements of the device. Monitoring arrangements for detecting an overload on a load particularly include a bimetallic release, a current transformer or a shunt on the corresponding current path for each phase of the load to be monitored.

In the case of monitoring by way of a bimetallic release, the current path to be monitored is coupled to a bimetallic release in such a way that, due to the current rise, heating of the bimetallic release, and ultimately a spatial deflection of a part of the bimetallic release, takes place. This deflection is detected and further evaluated. Using a bimetallic release, both direct currents and alternating currents can be detected. The typical setting range of the bimetallic release is from 1 to 1.6. A disadvantage of the bimetallic release is that it generates a high power loss. Thermal memory and electrical isolation between the individual conducting routes (phases) can be achieved with little effort in the case of bimetallic releases.

In the case of monitoring by way of a current transformer, the respective current transformer detects the current flow in the current path thereof, so that an evaluation unit can carry out a further analysis of the current flow and ultimately detect an imminent overload. A disadvantage of this measuring method is that DC currents cannot be detected. The setting range is from 1 to 10 and the power loss is low. However, a thermal memory cannot be simulated by the current transformer itself.

In the case of monitoring by way of a shunt, the shunt is integrated into the current path, so that voltage tapping to characterize the current flow can be carried out. Downstream analysis of the voltage across the shunt enables an imminent thermal overload to be detected. Using a shunt measurement method, detection of AC/DC currents is possible. The setting range is typically from 1 to 4. A disadvantage of the measuring method using a shunt is that a thermal memory cannot be simulated with voltage tapping at the shunt and the electrical isolation of the individual phases is possible only with great difficulty.

SUMMARY

Embodiments of the present invention provides a device and a method, respectively, with which the detection of an imminent overload on a load can take place. In particular, the device can monitor both direct currents and alternating currents. Furthermore, a simple electrical isolation of the monitoring arrangement from the current path to be monitored should preferably be enabled.

A device is disclosed for protecting a load, including a first current path having two lines, and a monitoring arrangement for detecting an imminent overload on the load, the monitoring arrangement comprising a first temperature measuring unit, an evaluation unit and a first measuring element which establishes an electrically conductive connection between the two lines of the first current path, wherein the first temperature measuring unit is electrically isolated from the first measuring element and comprises a first and a second temperature sensor, wherein the first and the second temperature sensors of the first temperature measuring unit can each detect a temperature of the first measuring element simultaneously and the evaluation unit can detect, based on the detected temperatures of the first temperature measuring unit, an imminent overload on the load.

A method is disclosed for protecting a load, wherein a device comprises a first current path having two lines and a monitoring arrangement for detecting an imminent overload on the load, the monitoring arrangement comprising a first temperature measuring unit, an evaluation unit and a first measuring element which establishes an electrically conductive connection between the two lines of the first current path, wherein the first temperature measuring unit is electrically isolated from the first measuring element and comprises a first and a second temperature sensor, wherein the first and second temperature sensors each detect a temperature of the first measuring element and the evaluation unit detects, based on the detected temperatures of the first temperature measuring unit, an imminent overload on the load.

Advantageous developments of the invention are disclosed in dependent claims.

BRIEF DESCRIPTION OF THE DRAWINGS

The invention and embodiments of the invention will now be described in greater detail making reference to the example embodiments illustrated in the drawings, in which:

FIG. 1 is a schematic view of a first current path which comprises a monitoring arrangement, FIG. 2 is a schematic representation of a device for protecting an electrical load.

DETAILED DESCRIPTION OF THE EXAMPLE EMBODIMENTS

Figure 3:
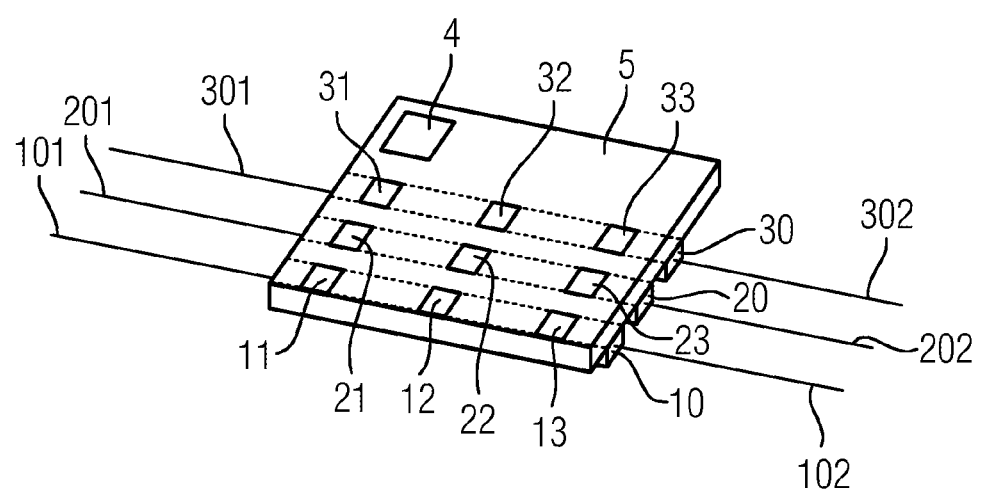
FIG. 3 is a schematic representation of a device for protecting an electrical load, wherein a monitoring arrangement is mounted on a circuit board.

A device is disclosed for protecting a load, including a first current path having two lines, and a monitoring arrangement for detecting an imminent overload on the load, the monitoring arrangement comprising a first temperature measuring unit, an evaluation unit and a first measuring element which establishes an electrically conductive connection between the two lines of the first current path, wherein the first temperature measuring unit is electrically isolated from the first measuring element and comprises a first and a second temperature sensor, wherein the first and the second temperature sensors of the first temperature measuring unit can each detect a temperature of the first measuring element simultaneously and the evaluation unit can detect, based on the detected temperatures of the first temperature measuring unit, an imminent overload on the load.

A method is disclosed for protecting a load, wherein a device comprises a first current path having two lines and a monitoring arrangement for detecting an imminent overload on the load, the monitoring arrangement comprising a first temperature measuring unit, an evaluation unit and a first measuring element which establishes an electrically conductive connection between the two lines of the first current path, wherein the first temperature measuring unit is electrically isolated from the first measuring element and comprises a first and a second temperature sensor, wherein the first and second temperature sensors each detect a temperature of the first measuring element and the evaluation unit detects, based on the detected temperatures of the first temperature measuring unit, an imminent overload on the load.

The current path is, in particular, part of a supply conductor of the energy supply for the load. The supply conductor is also referred to as a main circuit or a phase. During active operation of the load (e.g. an electric motor), a time-dependent motor current flows through the current path and therefore through the first measuring element, leading in the first measuring element to a defined heating of the first measuring element (current-related heating) depending on the current level and the conducting interval. The first measuring element has a characteristic heating behavior, dependent on the existing current level and conducting interval.

If an overload on the load is imminent, the thermal state of the first measuring element is different relative to the state during standard operation of the load. In particular, if an overload is imminent, a raised temperature exists at the first measuring element and consequently a characteristic heating behavior of the first measuring element takes place.

On current-related heating of the first measuring element, the temperature at the first measuring element is not uniform over the whole body of the first measuring element. Regions exist at the first measuring element which, at the same time point, have a higher or lower temperature than another region of the first measuring element. If, for example, the first measuring element has a uniform closed rectangular form, the temperature is typically higher in the central region of the longitudinal axis of the first measuring element than in the start or end regions of the longitudinal axis of the first measuring element. Therefore, depending on the current flow through the first measuring element, a characteristic heating behavior of the first measuring element comes about. By way of the first measuring unit, this current-related characteristic heating behavior of the first measuring element is detected so that the evaluation unit can reach a conclusion about the current flow at the first measuring element and ultimately about the present state of the load. It can therefore be determined whether proper operation pertains at the load or whether an overload has occurred.

A rise in the ambient temperature (due to an external temperature influence) can, for example, also lead to a temperature rise at the first measuring element so that the detection of an imminent overload based only on the detection of one temperature at the first measuring element would lead to a false analysis.

In order to minimize the influence of such external temperature influences on the detection of an imminent overload, the first temperature measuring unit detects, in particular, two temperatures of the first measuring element simultaneously. Measurement of the temperatures of the first measuring element is carried out at two measuring points of the first measuring element which can simultaneously have different temperatures during current-related heating of the first measuring element.

With simultaneously detected temperatures of the first measuring element, the evaluation unit can consequently calculate a temperature difference value ($\Delta Tn$) for the first measuring element. By way of the calculated temperature difference value ($\Delta Tn$), the evaluation unit can now reach a conclusion regarding the current-related heating of the first measuring element. For this purpose, for example, the temperature of the second temperature sensor ($Tn2$) is subtracted from the simultaneously detected temperature of the first temperature sensor (Tn1); (ΔTn=Tn2−Tn1). With simultaneous determination of a plurality of temperatures of the first measuring element by way of a plurality of temperature sensors, equivalent calculations can be made to determine a temperature difference value (ΔTn) of the first measuring element. The calculation of the temperature difference value (ΔTn) is carried out, in particular, by the evaluation unit.

The advantage of the evaluation using the temperature difference value (ΔTn) is, in particular, that external temperature influences can be mostly compensated for, so that heating mainly due to the current can be observed at the first measuring element. Therefore a precise analysis of current-related heating of the first measuring element takes place so that improved detection of an imminent overload on the load can be performed.

Therefore, by way of the first and second temperature sensors, a temperature of the first measuring element can be simultaneously detected and made available to the evaluation unit. Thus the evaluation unit can determine and evaluate a temperature difference value (ΔTn) per cycle (interval in which temperatures are simultaneously determined by the first temperature measuring unit). The evaluation unit can thus monitor for each cycle whether a current-related heating behavior of the measuring element, which characterizes an imminent overload on the load, has occurred or not.

The first measuring element is preferably a resistor (e.g. a shunt) with a constant power loss.

Evaluation of the temperature difference value (ΔTn) by the evaluation unit in order to detect an imminent overload on the load can take different forms. Preferably, a reference value which can be compared with a temperature difference value (ΔTn) or a plurality of temperature difference values (ΔTn) or a value derived therefrom is stored in the evaluation unit so that an imminent overload on the load can be detected. Thus the current-related heating behavior of the first measuring element is preferably characterized by the reference value.

One advantage attained with the invention lies therein that, by way of a device of this type or by way of a method of this type, both AC and DC currents can be detected. Therefore, an imminent overload can be detected for AC and DC loads. Furthermore, a better setting range can be achieved as compared with a bimetallic measuring method. Furthermore, a thermal memory can be realized since, if an overload is imminent, the first measuring element is strongly heated such that, based on the temperature and thus the cooling of the first measuring element, a cooling behavior of the load can be deduced. An evaluation of this type can also be realized, for example, by the evaluation unit.

In a further advantageous embodiment of the invention, the first temperature measuring unit also comprises a third temperature sensor, which can detect a temperature of the first measuring element simultaneously with the first and second temperature sensors of the first temperature measuring unit. With the third temperature sensor (Tn3), temperature detection is performed, in particular, at a measuring point of the first measuring unit, which is not detected by the first and second temperature sensors of the first temperature measuring unit. The measuring point of the third temperature sensor at the first measuring element preferably has, in at least one current-conducting state of the first measuring element, a different temperature than the measuring point of the second temperature sensor at the first measuring element.

Using the first, second and third temperature sensors, preferably the same side face of the first measuring element is monitored. In this way, an extremely precise determination of the heating behavior of the first measuring element can take place.

In a further advantageous embodiment of the invention, the first, second and third temperature sensors are arranged relative to the first measuring element such that the first temperature sensor can detect a temperature at a first measuring point of the first measuring element, the second temperature sensor can detect a temperature at a second measuring point of the first measuring element and the third temperature sensor can detect a temperature at a third measuring point of the first measuring element, wherein relative to a first side face of the first measuring element, the second measuring point lies between the first and third measuring points on the first side face.

Preferably, in at least one current-conducting state of the first measuring element, a higher temperature exists at the second measuring point as compared with the first and third measuring points. The first measuring point is situated, in particular, in the start region of an axis of the side face of the first measuring element, the third measuring point is situated in the end region of the axis and the second measuring point is situated in the middle region of the axis of the side face of the first measuring element. The axis of the side face of the first measuring element is preferably the longitudinal axis of the side face.

In order to determine the temperature difference value ($\Delta T_n$), for example, the following formula can be used:

$$\Delta T_n = \frac{(T_{n2} - T_{n1}) + (T_{n2} - T_{n3})}{2} = T_{n2} - \left(\frac{T_{n1} + T_{n3}}{2}\right)$$

$\Delta T_n$: temperature difference value
$T_{n1}$: determined temperature of the first temperature sensor at the first measuring point
$T_{n2}$: determined temperature of the second temperature sensor at the second measuring point
$T_{n3}$: determined temperature of the third temperature sensor at the third measuring point
n: measuring element being observed and thus the observed current path.

The temperature difference value can be determined by the evaluation unit for each cycle of a simultaneous determination of the individual temperatures of the temperature sensor. With a corresponding evaluation of the temperature difference value in the evaluation unit, it can ultimately be discovered whether proper operation of the load pertains or whether an overload on the load is imminent or already exists.

In a further advantageous embodiment of the invention, each temperature sensor is spaced a maximum of 2 mm apart from the first measuring element. In this way, precise detection of the temperature of the respective measuring point at the first measuring element can be carried out by the relevant temperature sensor.

In a further advantageous embodiment of the invention, an electrically isolating insulating layer is arranged between the temperature sensors of the first temperature measuring unit and the measuring element. By this, a reliable electrical isolation of the first temperature monitoring device from the first measuring element is ensured. Preferably, good thermal coupling of the temperature sensor to the corresponding measuring element is achieved with the electrically isolating insulating layer. The electrically isolating insulating layer is preferably used as a support for the temperature sensor so that the temperature sensor is fastened to the support. The electrically isolating insulating layer is, for example, FR4 or a ceramic material.

In a further advantageous embodiment of the invention, based on the temperatures of the first measuring element simultaneously detected by the temperature sensors, the evaluation unit can calculate a temperature difference value ($\Delta T_n$) for the first measuring element. If an overload exists on the load, then as compared with normal/nominal operation, a raised current flow and therefore a raised current-related heating takes place at the first measuring element. The first measuring element therefore shows a characteristic thermal behavior which can be detected by way of the temperature difference value. Using the reference value stored, preferably, in the evaluation unit, the heating behavior of the first measuring element, in particular, is characterized depending on the current flow and the conducting interval through the first measuring element. Through a comparison of the temperature difference value ($\Delta T_n$) of the first measuring element with the reference value, a distinction can therefore be made between current-related heating behavior from normal operation and current-related heating behavior of the first measuring element from an imminent overload. The comparison with the reference value can be made using a single temperature difference value ($\Delta T_n$) or with a plurality of temperature difference values ($\Delta T_n$).

In another advantageous embodiment of the invention, on detection of an imminent overload on the load, the evaluation unit can output a warning signal, in particular an electrical warning signal. A switch setting of a switching element of the device can preferably be controlled by way of the warning signal. By way of the switching element, either an auxiliary circuit or a main circuit (supply conductor of the energy supply of the electrical load) is controlled directly.

If the switching element controls the auxiliary circuit, the switching element is opened or closed so that a switching device (e.g. a contactor) switching the main circuit is actuated. This switching device switching the main circuit then opens the main circuit so that the current flow to the load is interrupted and therefore the overload on the load is prevented.

If the switching element controls the main circuit, the switching element is opened so that the current flow to the load is interrupted and therefore the overload on the load is prevented.

If a multi-phase load is present, preferably by detecting an imminent overload on only one current path of the device (and thus on only one phase of the load), all the phases of the load are opened so that the current flow to the load is cut off entirely.

In a further advantageous embodiment of the invention, the device also has a second current path which comprises two lines, wherein the monitoring arrangement also comprises a second temperature measuring unit and a second measuring element which creates an electrically conductive connection between the two lines of the second current path, wherein the second temperature measuring unit is electrically isolated from the second measuring element and comprises a first and a second temperature sensor, wherein the first and second temperature sensors of the second temperature measuring unit can each detect a temperature of the second measuring element simultaneously and the evaluation unit can detect, based on the detected temperatures of the second temperature measuring unit, an imminent overload on the load. The first and second temperature sensors are arranged relative to the second measuring element in particular such that through simultaneous detection of the temperature by the evaluation unit, a current-related characteristic heating behavior of the second measuring element can be determined.

A reference value which characterizes the heating behavior of the second measuring element is preferably stored in the evaluation unit. The evaluation unit can thus detect an imminent overload on the load by a comparison of the determined current-related heating behavior of the second measuring element with the reference value stored in the evaluation unit. Based on the current-related characteristic heating behavior of the second measuring element, the evaluation unit can thus distinguish between normal operation and an imminent overload.

In a further advantageous embodiment of the invention, the second temperature measuring unit also comprises a third temperature sensor, which can detect a temperature of the second measuring element simultaneously with the first and second temperature sensors of the second temperature measuring unit. Herein, temperature detection is performed, in particular, at a measuring point of the second measuring unit, which is not detected by the first and second temperature sensors of the second temperature measuring unit.

The arrangement of the temperature sensors of the second temperature measuring unit in relation to the second measuring element can be configured according to the arrangement of the first temperature measuring unit in relation to the first measuring element. Evaluation of the detected temperatures of the second temperature measuring unit can also be performed by the evaluation unit similarly to the evaluation of the temperatures of the first temperature measuring unit by the evaluation unit. Furthermore, an electrically isolating insulating layer can be arranged (as between the first measuring element and the first temperature measuring unit) between the temperature sensors of the second temperature measuring unit and the second measuring element.

In a further advantageous embodiment of the invention, the device has a third current path which comprises two lines, wherein the monitoring arrangement also comprises a third temperature measuring unit and a third measuring element which creates an electrically conducting connection between the two lines of the third current path, wherein the third temperature measuring unit is electrically isolated from the third measuring element and comprises a first and a second temperature sensor, wherein the first and second temperature sensors of the third temperature measuring unit can each simultaneously detect a temperature of the third measuring element and the evaluation unit can detect, based on the detected temperatures of the third temperature measuring unit, an imminent overload on the load. The first and second temperature sensors are arranged relative to the third measuring element, in particular, such that through simultaneous detection of the temperature by the evaluation unit, a current-related heating behavior of the third measuring element can be determined.

The evaluation unit can thus detect an imminent overload on the load, preferably by a comparison of the determined heating behavior of the third measuring element with the reference value stored in the evaluation unit. Through the reference value, the heating behavior, in particular, of the third measuring element is known to the evaluation unit, so that an imminent overload on the load can be detected.

In a further advantageous embodiment of the invention, the third temperature measuring unit also comprises a third temperature sensor which can detect a temperature of the first measuring element simultaneously with the first and second temperature sensors of the third temperature measuring unit. Herein, temperature detection is performed, in particular, at a measuring point of the third measuring unit, which is not detected by the first and second temperature sensors of the third temperature measuring unit.

The arrangement of the temperature sensors of the third temperature measuring unit in relation to the third measuring element can be configured according to the arrangement of the first temperature measuring unit in relation to the first measuring element. Evaluation of the detected temperatures of the third temperature measuring unit can also be performed by the evaluation unit similarly to the evaluation of the temperatures of the first temperature measuring unit by the evaluation unit. Furthermore, an electrically isolating insulating layer can be arranged (as between the first measuring element and the first temperature measuring unit) between the temperature sensors of the third temperature measuring unit and the third measuring element.

The electrically isolating insulating layer is preferably a support material for the respective temperature sensors. Preferably, the temperature sensors of the first, second and third temperature measuring units are placed on the same insulating layer.

It is also conceivable for the first and/or second and/or third temperature measuring units to comprise further temperature sensors so that more precise determination of the current-related heating behavior of the associated measuring element can take place.

In a further advantageous embodiment of the invention, each temperature sensor is configured such that said sensor assumes a characteristic state depending on the prevailing temperature. The temperature sensor is, in particular, a thermocouple, a thermowire or a temperature-dependent semiconductor (e.g. diode). If, for example, a diode is used as the temperature sensor, then, based on a measurement of the voltage at the diode, a conclusion can be drawn concerning the prevailing temperature. A temperature change in the first measuring element would thus lead to a temperature change at the diode resulting in a voltage change.

In a further advantageous embodiment of the invention, the first measuring element and, where present, the second and/or third measuring element are each an electrical resistor, in particular, a shunt. Preferably, the measuring element has a constant power loss and a current-dependent characteristic heating curve.

Part of the heating curve of each measuring element is available to the evaluation unit as a reference value, so that the evaluation unit can recognize an imminent overload by comparing the determined current-related heating behavior with the reference value. If the measuring elements and the associated temperature sensors of the temperature measuring unit are identically configured, the reference value for the measuring elements is identical.

In a further advantageous embodiment of the invention, the device is a switching device, in particular an overload relay or a circuit breaker. The device is arranged, in particular, remote from the load and thus is not a part of the load (e.g. electric motor).

The temperature sensors of the first, second and/or third temperature measuring unit can preferably detect temperature differences of approximately 4 Kelvin.

The first, second and/or third measuring element preferably have a temperature in the range of approximately 60° C.-100° C. during nominal operation. However, during a maximum overload on the load, a temperature in the range of 600° C. to 700° C. can arise at the relevant measuring element.

FIG. 1 shows a schematic view of a first current path which comprises a monitoring arrangement. The current path shown is part of a device for protecting a downstream load. By way of the monitoring arrangement, an imminent overload on the load can be detected. For this purpose, the device is integrated into the conducting route of the load. If, for example, the load is a three-phase motor, then at least one supply conductor (phase) of the three-phase motor has the current path and monitoring arrangement illustrated.

The first current path comprises a first line 101 and a second line 102. The monitoring arrangement comprises a first temperature measuring unit, an evaluation unit 4 and a first measuring element 10. The first temperature measuring unit comprises a first temperature sensor 11, a second temperature sensor 12 and a third temperature sensor 13.

The first measuring element 10 is arranged between the first line 101 and the second line 102 of the first current path so that a current can flow from the first line 101 via the first measuring element 10 to the second line 102. Since the supply of energy to the downstream load takes place via the first and the second lines 101, 102, during operation of the downstream load, the current flows via the first measuring element 10. A current level which depends on the prevailing operational state of the downstream load exists at the first measuring element 10. Depending on this current level and the conducting interval at the first measuring element 10, a characteristic heating behavior of the first measuring element 10 takes place. By way of the temperature sensors 11, 12, 13, the characteristic heating behavior of the first measuring element 10 is detected and made available to the evaluation unit 4. If a thermal overload on the load is imminent, then a raised current level exists at the first measuring element 10. Therefore, through analysis of the characteristic heating of the first measuring element 10 by the evaluation unit 4, a conclusion can be drawn regarding the existing state of the downstream load. For this purpose, a reference value which characterizes the heating behavior of the first measuring element 10 when an overload on the downstream load is imminent is stored in the evaluation unit. During nominal operation, typically a temperature in the range of 60° C. to 100° C. exists at the first measuring element 10. However, if an overload occurs on the load, then due to the increased current flow, a temperature of up to 700° C. can arise at the first measuring element 10.

Thus, by monitoring the temperature of the first measuring element 10, an imminent overload on the load can be detected. In this exemplary embodiment, the temperature measuring unit 18 therefore has three temperature sensors 11, 12, 13. An embodiment having only two temperature sensors or more than three temperature sensors per temperature measuring unit is also conceivable. The first, second and third temperature sensors 11, 12, 13 are spaced a maximum of 2 mm apart from the first measuring element 10 and can each detect a temperature of a specific measuring point of the first measuring element 10. The three temperature sensors 11, 12, 13 do not detect the same measuring points on the first measuring element 10. An electrically isolating insulating layer 51 is arranged between the three temperature sensors 11, 12, 13 and the first measuring element 10, so that an electrical isolation is ensured between the first measuring element and the three temperature sensors 11, 12, 13. The three temperature sensors 11, 12, 13 are all fastened onto the electrically insulating insulating layer 51.

In order to determine the prevailing heating behavior of the first measuring element 10, the first, second and third temperature sensors 11, 12, 13 are arranged relative to the first measuring element 10 such that temperatures of three different measuring points of a first side face 6 of the first measuring element 10 can be detected. Said measuring points are distributed over the first side face 6 such that by simultaneous determination of the temperatures of the three measuring points with the three temperature sensors 11, 12, 13, a current-related characteristic heating behavior of the first measuring element 10 can be determined.

The measuring point of the first and third temperature sensors 11, 13 is arranged, in particular, in the edge region of the longitudinal axis of the side face 6 of the first measuring element 10, whereas the measuring point of the second temperature sensor 12 lies in the center of the longitudinal axis of the side face 6 of the first measuring element 10.

During active operation of the load, a current flow exists at the first measuring element 10. Depending on the current level and the conducting interval, the first measuring element 10 exhibits a current-related characteristic heating behavior. In the current-conducting state of the first measuring element 10, in particular, the temperature of the central measuring point at the side face 6 as determined by the second temperature sensor is raised relative to the temperatures of the two measuring points in the edge region. Depending on the current level and the conducting interval, the first measuring element 10 consequently assumes a characteristic temperature which can be different over the whole body of the first measuring element 10. Therefore, depending on the current level and the conducting interval at the first measuring element 10, a characteristic heating behavior of the first measuring element 10 takes place. With the simultaneous determination of the temperatures of the three measuring points at the first measuring element 10 and a comparison of the determined temperatures with a reference value in the evaluation unit, a conclusion can therefore be drawn regarding the operating state of the downstream load so that an imminent overload can be detected.

In that particularly the current-related heating behavior of the first measuring element 10 is detected by the temperature measuring unit, in particular, external interfering variables (internal and external foreign heat sources) can be compensated for as far as possible.

The side face 6 of the first measuring element 10 has, in particular, a size of less than 10 cm$^2$.

The first, second and third temperature sensors 11, 12, 13 each consist of a semiconductor, in particular a diode, so that by measuring the voltage thereof, a conclusion can be drawn about the prevailing temperature of the corresponding measuring point at the first measuring element.

The determined temperatures of the first, second and third temperature sensors 11, 12, 13 are made available to the evaluation unit 4, so that the evaluation unit can determine the prevailing heating behavior of the first measuring element 10. By way of the temperature sensors 11, 12, 13, a temperature difference of approximately 4 Kelvin in the range from −10° C. to 200° C. can be determined.

The first measuring element 10 is a metallic electrical resistor (shunt) which has a characteristic heating behavior. The characteristic heating behavior of the first measuring element 10 is available to the evaluation unit 4 as a reference value so that, based on a comparison of the determined prevailing temperature of the first measuring element 10 and thus of the heating behavior of the first measuring element 10 with the reference value stored in the evaluation unit 4, the evaluation unit 4 can draw a conclusion concerning the prevailing loading condition (normal operation/imminent overload) of the load. The evaluation unit 4 can therefore continuously monitor a value characterizing the current level and conducting interval, so that, based on the prevailing heating behavior of the first measuring element 10 and thus based on the thermal state thereof, a motor or conductor protection can be derived. It is therefore possible to monitor whether an overload exists on the downstream load or not.

In FIG. 1, only one phase is monitored by the monitoring arrangement. However, it is equally conceivable that for multi-phase loads, each phase or at least two phases, comprise(s) a temperature measuring unit.

The temperature sensors 11, 12 can measure the temperature differences with a high resolution, for example, approximately 4 Kelvin. In this way it is possible to use small temperature differences and small electrical resistance values of the first measuring element 10. By this, the measurement range with regard to the current lower limit IU can be significantly increased downwardly, so that the setting range can be significantly increased as compared, for example, with the bimetallic release. A typical value for the temperature necessary with bimetallic releases is, for example, 60 Kelvin overtemperature. However, for a release by way of a first measuring element 10, current-related heating of only 4 Kelvin can be determined. A setting range of greater than 1 to 4 can thus be realized.

The heating of the first measuring element 10 is largely independent of frequency and is therefore suitable for AC and DC uses.

FIG. 2 shows a schematic representation of a device 1 for protecting an electrical load 2. In this exemplary embodiment, the device 1 is an overload relay 1 with which a load 2, specifically a three-phase electric motor, can be monitored. For this purpose, the overload relay 1 is inserted into the supply line of the load 2 so that, with the circuit breaker 1, the three phases of the load 2 can be monitored.

So that the overload relay 1 can be integrated into the supply line of the electrical load 2, the circuit breaker has input-side connection devices 106, 206, 306 and output-side connection devices 107, 207, 307. The individual phases of the load 2 are arranged electrically isolated in the overload relay 1. The first phase is fed via the first current path, the second phase is fed via the second current path, and the third phase of the load 2 is fed via the third current path. The first, second and third current path and the monitoring arrangement thereof are each configured in accordance with the embodiment as described and as illustrated in FIG. 1. Only the evaluation unit 4 has been consolidated. It is also conceivable that a separate evaluation unit 4 is provided per current path.

The overload relay 1 comprises a monitoring arrangement with which an imminent overload of the electrical load 2 can be detected. For this purpose, the first current path comprises, as FIG. 1 shows, a first line 101 and a second line 102. Arranged between the first line 101 and the second line 102 is a first measuring element 10 which creates an electrical connection between the two lines 101 and 102. The first measuring element 10 is, in particular, a metallic electrical resistor. Depending on the existing current level and the conducting interval in the first current path 100, a defined heating behavior of the first measuring element 10 takes place.

The temperature of the first measuring element 10 can be detected simultaneously by way of a first, second and third temperature sensor 11, 12, 13 of a first temperature measuring unit. The simultaneously detected temperature of the temperature sensors 11, 12, 13 of the first temperature measuring unit is made available to the evaluation unit 4. An electrically insulating layer 51 between the first measuring element 10 and the temperature sensors 11, 12, 13 provides an electrical isolation between the temperature sensors 11, 12, 13 and the first measuring element 10 and serves as a support material for the temperature sensors 11, 12, 13.

The energy supply to the second phase of the load 2 is fed via the second current path. The second current path has a first line 201 and a second line 202. Arranged between the first and second lines 201 and 202 is a second measuring element 20 which ensures an electrical connection between the first line 201 and the second line 202. Like the first measuring element 10 of the first current path, the second measuring element 20 is also a defined resistor which assumes a characteristic thermal state depending on the existing current flow and the existing conducting interval. The temperature distribution at the second measuring element 20 can be determined by way of a second temperature measuring unit. The second temperature measuring unit comprises a first, second and third temperature sensor 21, 22, 23. The temperature sensors 21, 22, 23 of the second temperature measuring unit are also separated by way of an electrically isolating insulating layer 52 from the second measuring element 20. By comparing the simultaneously detected temperatures of the temperature sensors 21, 22, 23 of the second temperature measuring unit with a reference value which is stored in the evaluation unit 4 and which characterizes a thermal behavior of the second measuring element 20 characterizing an imminent overload, the evaluation unit 4 can determine the existing current-related thermal state of the second measuring element and thereby detect an imminent overload on the load.

The energy supply of the third phase of the load 2 is fed via the third current path so that the third phase can be monitored for overload. The third current path has a first line 301 and a second line 302. Arranged between the first and second lines 301, 302 is a third measuring element 30 which connects the first and second lines 301, 302 in an electrically conducting manner. A current flowing along the third current path therefore flows via the third measuring element 30. Depending on the current level and the conducting interval at the third phase, a characteristic current-related heating behavior takes place at the third measuring element 30. In order to determine the current-related heating behavior, the temperature of the third measuring element 30 is detected simultaneously at three measuring points by three temperature sensors 31, 32, 33. The temperature detected is also made available to the evaluation unit 4 for further analysis. An electrically insulating layer 53 is arranged between the temperature sensors 31, 32, 33 and the third measuring element 30 so that the third temperature measuring unit is electrically isolated from the third measuring element 30.

The individual current paths therefore each have a measuring element 10, 20, 30 which, depending on the prevailing current level and the conducting interval, perform characteristic current-related heating. By monitoring of the current-related heating behavior of the respective measuring elements 10, 20, 30 and a comparison with the stored reference value, a conclusion can be drawn regarding the existing current flow in the corresponding current path and therefore a conclusion can be drawn regarding the existing operating state of the load 2, so that an imminent overload on the load 2 can be detected by the evaluation unit 4.

The first, second and third measuring elements 10, 20, 30 and the first, second and third temperature measuring units are each constructed identically. The evaluation of the determined temperatures of the first, second and third temperature measuring units can therefore take place uniformly.

The heating characteristic of the first, second and third measuring elements 10, 20, 30 is known to the evaluation unit 4 and is stored as a reference value, so that the evaluation unit 4 can detect an imminent overload on the electrical load 2 by comparing the determined temperatures of the first, second and/or third temperature measuring units with the reference value. When an imminent overload on the load 2 is detected, the evaluation unit 4 outputs a warning signal so that switching elements (not shown) of the load 2 can be switched and the energy flow to the load 2 can thus be prevented. In this way, thermal damage to the load 2 in relation to an overload can be prevented by the device 1.

Since a thermal overload on the load 2 is detected by the heating of the measuring element 10, 20, 30, the measuring element 10, 20, 30 also provides a thermal memory so that the load cannot be accidentally switched on shortly after a thermal overload. Only after the measuring element 10, 20, 30 has undergone a defined cooling, can the load 2 be connected to the supply network again, so that the load is supplied with current once again. The determination of the necessary cooling of the load is also carried out by analyzing the temperatures of the measuring elements 10, 20, 30. For this purpose, the temperature of the measuring element 10, 20, 30 concerned is determined by the relevant temperature measuring unit and evaluated by the evaluation unit 4. For this purpose, cooling reference values are also available to the evaluation unit 4.

The device 1 for monitoring a thermal overload of a load 2 is illustrated in FIG. 2 using the example of an overload relay 1. The device 1 can also be, for example, a circuit breaker (e.g. a motor overcurrent protection or system protection switch).

The temperature sensors 11, 12, 13, 21, 22, 23, 31, 32, 33 are each semiconductors, in particular diodes, so that through analysis of the voltage thereof, the temperature at the temperature sensors and therefore at the associated measuring point of the corresponding measuring element 10, 20, 30 can be determined. In order to increase the measuring accuracy, a plurality of temperature sensors can also be placed on the measuring elements 10, 20, 30. It is also conceivable for just two temperature sensors to be provided for each measuring element 10, 20, 30.

A line for which protection against thermal overload must be ensured can also be regarded as the load 2.

A great advantage of the device 1 and, in particular, of the monitoring arrangement lies therein that the electrical isolation between the individual phases and between the individual temperature sensors 11, 12, 13, 21, 22, 23, 31, 32, 33 and the corresponding current paths is easy to create.

FIG. 3 shows a schematic representation of a device for protecting an electrical load, wherein a monitoring arrangement is mounted on a circuit board 5. As distinct from the monitoring arrangement according to FIG. 2, the first, second and third temperature measuring units and the evaluation unit 4 are arranged on an upper side of a single circuit board 5 and the measuring units 10, 20, 30 are mounted on the underside of the circuit board 5.

The first measuring element 10 is mounted on the underside of the circuit board 5 and is connected on the input side to a line 101 and on the output side to a line 102. The energy supply to a downstream load (first phase) takes place via this first current path.

The second measuring element 20 is also mounted on the underside of the circuit board 5 and is connected on the input side to a line 201 and on the output side to a line 202. The energy supply to a downstream load (second phase) takes place via this second current path.

The third measuring element 30 is also mounted on the underside of the circuit board 5 and is connected on the input side to a line 301 and on the output side to a line 302. The energy supply to a downstream load (third phase) takes place via this third current path.

Mounted on the upper side (facing away from the measuring elements 10, 20, 30) of the circuit board 5 are the first, second and third temperature measuring unit and the evaluation unit 4. The circuit board provides electrical isolation between the first, second and third temperature measuring units and the evaluation unit 4 in relation to the measuring elements 10, 20, 30.

The first temperature measuring unit comprises three temperature sensors 11, 12, 13, wherein two temperature sensors 11, 13 are arranged in the edge region (start and end) of the longitudinal axis of a side face of the first measuring element 10 and one temperature sensor 12 is arranged in the center of the longitudinal axis of the side face of the first measuring element 10. In this way, a temperature difference value ($\Delta T_n$) of the first measuring element 10 can be determined.

The second temperature measuring unit comprises three temperature sensors 21, 22, 23, wherein two temperature sensors 21, 23 are arranged in the edge region (start and end) of the longitudinal axis of a side face of the second measuring element 20 and one temperature sensor 22 is arranged in the center of the longitudinal axis of the side face of the second measuring element 20. In this way, a temperature difference value ($\Delta T_n$) of the second measuring element 20 can be determined.

The temperature sensors 31, 32, 33 of the third temperature measuring unit are arranged in relation to the third measuring element 30 similarly to the temperatures sensors of the first temperature measuring unit in relation to the first measuring element 10.

Since the temperature sensors 11, 12, 13, 21, 22, 23, 31, 32, 33 are arranged in relation to the measuring elements 10, 20, 30 at the opposite side faces of the circuit board 5, good thermal coupling is achieved between the temperature sensors 11, 12, 13, 21, 22, 23, 31, 32, 33 and the measuring elements 10, 20, 30, along with simultaneous electrical isolation.

Therefore, for each temperature measuring unit, by way of the simultaneous determination of the temperatures of the temperature sensors 11, 12, 13, 21, 22, 23, 31, 32, 33, a temperature difference value ($\Delta T_n$) can be calculated. This temperature difference value ($\Delta T_n$) is preferably calculated as follows:

$$\Delta T_n = \frac{(T_{n2} - T_{n1}) + (T_{n2} - T_{n3})}{2} = T_{n2} - \left(\frac{T_{n1} + T_{n3}}{2}\right)$$

$\Delta T_n$: temperature difference value
$T_{n1}$: determined temperature of the first temperature sensor 11, 21, 31 at the first measuring point
$T_{n2}$: determined temperature of the second temperature sensor 12, 22, 32 at the second measuring point
$T_{n3}$: determined temperature of the third temperature sensor 13, 23, 33 at the third measuring point
n: measuring element 10, 20, 30 and thus current path being observed $$\Delta T_{Sum} = \sum_{t=t_{Integr,Start}}^{t_{Integr,Ende}} \Delta T_n(dt)$$

$\Delta T_n$: is the temperature difference value of the respective measuring element "n" 10, 20, 30 at the respective evaluation time point at which the temperatures are simultaneously detected by the respective temperature measuring units.
n: is the measuring element 10, 20, 30 under consideration and thus the current path being observed
$t=t_{integr,Start}$: start of the integration interval
$t=t_{integr,Ende}$: end of the integration interval According to the above-mentioned evaluation principle, TARGET values are stored in the evaluation unit 4 as reference values and, depending on the integration interval $t_{integr}$, characterize normal operation or an imminent overload on the load. For each integration interval, a comparison of the determined ACTUAL value ($\Delta T_{Sum}$) with the TARGET value (reference value) can therefore be made. If the TARGET value (reference value) is exceeded by the determined ACTUAL value, an overload on the load is imminent.

The relevant TARGET value is stored, for example, in table form or as a polynomial formula in the evaluation unit so that a specific TARGET value is present as a reference value for each evaluation time point. The TARGET value can differ depending, in particular, on the prevailing conducting interval and current level at the respective measuring element 10, 20, 30. Equally, during the analysis, the integration interval can vary. Depending on the existing integration interval, corresponding TARGET values are stored in the evaluation unit. The current/time tripping characteristics of modern thermomechanical releases are preferably modeled with the TARGET values.

A further evaluation method can be achieved by evaluating the rise speed of the temperature difference value $\Delta T_n$. Herein, the ACTUAL value is calculated according to the following formula:

$$\left(\frac{d\Delta T_n}{dt}\right)_x = \frac{\Delta T_{nx} - \Delta T_{n(x-1)}}{t_x - t_{x-1}}$$

$\Delta T_n$: is the temperature difference value of the respective measuring element "n" 10, 20, 30 at the respective evaluation time point at which the temperatures are detected by the respective temperature measuring units.
n: is the measuring element 10, 20, 30 under consideration and thus the current path being observed
x: is the evaluation time point (current time point of the measurement evaluation)

A TARGET value is stored in the evaluation unit as a reference value which gives the time point (triggering time point) at which an overload on the load is imminent. The TARGET value characterizes a characteristic rise speed of the temperature difference value $\Delta T_n$ on exceeding of which, an overload on the load is imminent. The relevant TARGET value is stored, for example, in table form or as a polynomial formula in the evaluation unit so that a specific TARGET value is present as a reference value for each evaluation time point (time point of the TARGET-ACTUAL comparison).

It is also conceivable to combine the above-described evaluation methods (evaluation of the temperature difference value, evaluation according to the integration process of the temperature difference value and evaluation of the rise speed of the temperature difference value) as the triggering criterion.

It is therefore conceivable that for relatively short triggering times and relatively high motor currents, the "evaluation of the rise speed of the temperature difference value" takes place and, for relatively long tripping times and relatively short motor currents, the "evaluation of the temperature difference value" takes place.

It is also conceivable for the integration interval of the "evaluation according to the integration process of the temperature difference value" to be changed depending on the actual "rise speed of the temperature difference value".

It is also conceivable, in addition to the above-described evaluation methods, to carry out an evaluation of the absolute temperature of the respective measuring element 10, 20, 30.

Formation of the temperature difference value $\Delta T_n$ of a multi-point temperature detection system naturally offers the advantage of being insensitive to many temperature influences. Severe external temperature influences can, under certain circumstances, no longer be compensated for through this multi-point measurement. It can therefore be useful to extend the evaluation methods with an evaluation of the absolute temperature of the measuring elements 10, 20, 30. In this way, for example, strong external temperature influences can be recognized and, if necessary, taken into account in the evaluation unit 4, in addition to the above-described evaluation methods.

Rapid and strong cooling of the supply conductor(s) 101, 102, 301, 102, 202, 203 can lead to a temperature fall at one or more temperature measuring points of a multi-point temperature detection system. This affects, in particular, the measuring points which have the smallest separation from the lines 101, 201, 301, 102, 202, 302 of the current paths. With evaluation of the temperature difference value $\Delta T_n$ alone, this would be interpreted as a current flow through the corresponding measuring element 10, 20, 30. As a countermeasure, an increase in the temperature difference value $\Delta T_n$ could be carried out by the evaluation unit 4.

Rapid and severe heating of the supply conductor(s) 101, 201, 301, 102, 202, 302 can lead to a temperature rise at one or more temperature measuring points of a multi-point temperature detection system. With evaluation of the temperature difference value $\Delta T_n$ alone, this would be interpreted as switching off of the current flow through the corresponding measuring element 10, 20, 30. As a countermeasure, a decrease in the temperature difference value $\Delta T_n$ could be carried out by the evaluation unit 4.

The invention claimed is:

1. A device for protecting a load including a first current path having two lines, and a monitoring arrangement for detecting an imminent overload on the load, the monitoring arrangement comprising:
    a first temperature measuring unit;
    an evaluation unit; and
    a first measuring element, configured to create an electrically conductive connection between the two lines of the first current path, wherein
        the first temperature measuring unit is electrically isolated from the first measuring element and includes a first and a second temperature sensor, wherein the first and second temperature sensors of the first temperature measuring unit are each configured to detect a temperature of the first measuring element simultaneously, and wherein the evaluation unit is configured to detect, based on the detected temperatures of the first temperature measuring unit, an imminent overload on the load, the first and second temperature sensors being arranged in a row along the two lines, the temperature sensors having a resolution of approximately 4 Kelvin.

2. The device of claim 1, wherein the first temperature measuring unit also includes a third temperature sensor, configured to detect a temperature of the first measuring element, simultaneously with the first and second temperature sensors of the first temperature measuring unit.

3. The device of claim 2, wherein the first, second and third temperature sensors are arranged on a side face of the first measuring element such that the first temperature sensor is configured to detect a temperature at a first measuring point of the first measuring element, the second temperature sensor is configured to detect a temperature at a second measuring point of the first measuring element and the third temperature sensor is configured to detect a temperature at a third measuring point of the first measuring element, wherein in relation to the first side face of the first measuring element, the second measuring point lies between the first and third measuring points on the first side face.

4. The device of claim 1, wherein each of the temperature sensors are spaced a maximum of 2 mm apart from the first measuring element.

5. The device of claim 1, wherein an electrically isolating insulating layer is arranged between the temperature sensors of the first temperature measuring unit and the measuring element.

6. The device of claim 1, further comprising a second current path which includes two lines, wherein the monitoring arrangement further comprises a second temperature measuring unit and a second measuring element configured to create an electrically conductive connection between the two lines the second current path, wherein the second temperature measuring unit is electrically isolated from the second measuring element and comprises a first and a second temperature sensor, wherein the first and second temperature sensors of the second temperature measuring unit are configured to detect a temperature of the second measuring element simultaneously and wherein the evaluation unit is configured to detect, based on the detected temperatures of the second temperature measuring unit, an imminent overload on the load.

7. The device of claim 6, wherein the second temperature measuring unit further comprises a third temperature sensor, configured to detect a temperature of the second measuring element simultaneously with the first and second temperature sensors of the second temperature measuring unit.

8. The device of claim 6, further comprising a third current path which includes two lines, wherein the monitoring arrangement further comprises a third temperature measuring unit and a third measuring element configured to create an electrically conductive connection between the two lines of the third current path, wherein the third temperature measuring unit is electrically isolated from the third measuring element and includes a first and a second temperature sensor, wherein the first and second temperature sensors of the third temperature measuring unit are each configured to detect a temperature of the third measuring element simultaneously and wherein the evaluation unit is configured to detect, based on the detected temperatures of the third temperature measuring unit, an imminent overload on the load.

9. The device of claim 8, wherein the third temperature measuring unit also comprises a third temperature sensor, configured to detect a temperature of the first measuring element simultaneously with the first and second temperature sensors of the third temperature measuring unit.

10. The device of claim 1, wherein the respective temperature sensor are semiconductors.

11. The device of claim 1, wherein the device is a switching device.

12. A method for protecting a load, wherein a device includes a first current path having two lines and a monitoring arrangement for detecting an imminent overload on the load and wherein the monitoring arrangement includes a first temperature measuring unit, an evaluation unit and a first measuring element configured to create an electrically conductive connection between the two lines of the first current path, wherein the first temperature measuring unit is electrically isolated from the first measuring element and includes a first and a second temperature sensor, the temperature sensors having a resolution of approximately 4 Kelvin, the first and second temperature sensors being arranged in a row along the two lines, the method comprising:
- detecting, using the first and second temperature sensors having the resolution of approximately 4 Kelvin, a temperature of the first measuring element simultaneously; and
- detecting, using the evaluation unit and based on the detected temperatures of the first temperature measuring unit, an imminent overload on the load.

13. The method of claim 12, further comprising:
- detecting, by the evaluation unit, current-related heating of the first measuring element using the simultaneously detected temperatures of the first temperature measuring unit.

14. The device of claim 2, wherein each of the temperature sensors are spaced a maximum of 2 mm apart from the first measuring element.

15. The device of claim 3, wherein each of the temperature sensors are spaced a maximum of 2 mm apart from the first measuring element.

16. The device of claim 6, wherein the respective temperature sensor are semiconductors.

17. The device of claim 8, wherein the respective temperature sensor are semiconductors.

18. The device of claim 1, wherein the respective temperature sensors are diodes.

19. The device of claim 6, wherein the respective temperature sensor are diodes.

20. The device of claim 8, wherein the respective temperature sensor diodes.

21. The device of claim 11, wherein the switching device is an overload relay or a circuit breaker.

* * * * *